United States Patent [19]
Popescu

[11] Patent Number: 5,734,284
[45] Date of Patent: Mar. 31, 1998

[54] RC CIRCUIT

[75] Inventor: Petre Popescu, Kanata, Canada

[73] Assignee: Northern Telecom Limited, Montreal, Canada

[21] Appl. No.: 728,986

[22] Filed: Oct. 11, 1996

[51] Int. Cl.$^6$ .................................................. H03H 11/26
[52] U.S. Cl. ........................................ 327/283; 327/276
[58] Field of Search ..................................... 327/268, 278, 327/283, 280, 284, 287, 290, 344, 552, 553, 558, 269; 330/306

[56] References Cited

U.S. PATENT DOCUMENTS

| | | | |
|---|---|---|---|
| 4,797,586 | 1/1989 | Traa | 327/287 |
| 4,801,827 | 1/1989 | Metz | 327/280 |
| 4,943,745 | 7/1990 | Watanabe et al. | 327/280 |
| 5,594,390 | 1/1997 | Holzer | 327/558 |
| 5,652,543 | 7/1997 | Fenk et al. | 330/306 |

*Primary Examiner*—Toan Tran
*Attorney, Agent, or Firm*—Angela C. de Wilton

[57] ABSTRACT

An RC circuit with voltage controlled delay is provided. The circuit comprises a matched pair of RC delay elements, driven by outputs of a pair of amplifiers comprising a fixed gain amplifier and a variable gain amplifier having gain m so that the delay is dependent on a gain control voltage. Preferably, the circuit is operable in a regime wherein the gain m is linearly dependent on an input control voltage so that the circuit delay is also linearly dependent on the input control voltage. Advantageously, where the amplifier gain has non-linear dependence on a gain control voltage, a control voltage generator comprising a linear to logarithmic converter is used to provide an effective linear operation in response to an input control voltage. The circuit is preferably operated in differential mode, with RC circuit elements implemented simply as resistors and capacitors, and the amplifier and active elements provided by bipolar transistors. Alternatively, MOS devices may be used for R, C elements and active devices. Although differential operation is preferred, single ended operation is an option if one of the pair of input signals is a reference voltage.

9 Claims, 4 Drawing Sheets

RC CIRCUIT

FIELD OF THE INVENTION

This invention relates to an resistor-capacitor (RC) circuit with applications for filtering, delay or phase shifting.

BACKGROUND OF THE INVENTION

RC type delay circuits, filter circuits or phase corrector circuits are used in many digital and analog integrated circuit applications. RC circuits are simple to implement and have good linearity, which is limited only by the linear range of the resistance (R) and capacitance (C) components.

The main limitation is the practical tolerance ranges of the R and C components, particularly in the fabrication of monolithic integrated circuits, which result in a wide spread in the delay time (or pole frequency in the frequency domain).

SUMMARY OF THE INVENTION

The present invention seeks to provide an RC delay circuit or filter circuit which avoids or overcomes the above-mentioned problem.

Thus according to one aspect of the present invention there is provided a circuit for receiving a pair of input signals and generating a pair of output signals having a controllable delay relative to the pair of input signals, the circuit comprising:

- a pair of amplifiers, each amplifier having input means for independently receiving the pair of input signals and output means for generating a pair of output signals, each amplifier having a second input means for receiving a pair of control voltage signals, the first amplifier having a non-variable gain and the second amplifier having a variable gain responsive to the control voltage signals;

- biasing means for providing operating voltage to each of the pair of amplifiers;

- a pair of RC delay circuits each comprising a capacitor element and a resistance element, for receiving the pair of output signals from the pair of amplifiers and generating a pair of output signals having a delay dependent on the gain control voltage fed to the second amplifier.

Thus an RC circuit with a variable and controllable delay is provided. Specifically, the circuit is operable so that an increase in control voltage increases the delay of the circuit. Thus, an RC delay circuit is provided in which the delay time (pole frequency in the frequency domain) is controllable using a control voltage coupled through a pair of amplifiers.

Beneficially the pair of amplifiers each comprises a balanced multiplier. Thus two identical balanced multipliers may be provided, one configured as a variable gain amplifier, and a similar one to provide a fixed gain amplifier in which the collector is configured in a cascode amplifier configuration. Consequently the propagation delay through each amplifier is matched.

Where the amplifiers are of the type for which the gain of the amplifiers has a non-linear dependence on the control voltage, the circuit beneficially comprises a reference voltage generator. Thus for example, the reference voltage generator comprises a linear to logarithmic converter having input means for receiving an input control voltage signal, thereby providing a circuit having an effective linear dependence of the gain of the variable amplifier on the input control voltage. That is, the circuit operates in an effectively linear regime, because the converter compensates for the exponential dependence of the gain of the amplifier on the control voltage to provide a gain which is linearly dependent on an input control voltage applied to the voltage generator.

The resistor and capacitor elements of the RC circuit may be actual resistors and capacitors, or alternatively they may be implemented as active MOS devices.

Differential operation is generally preferred for monolithic integrated circuit applications. Alternatively, for single ended operation, one of the pair of differential input signals is provided by a reference voltage.

DESCRIPTION OF THE EMBODIMENTS

Figure 1:
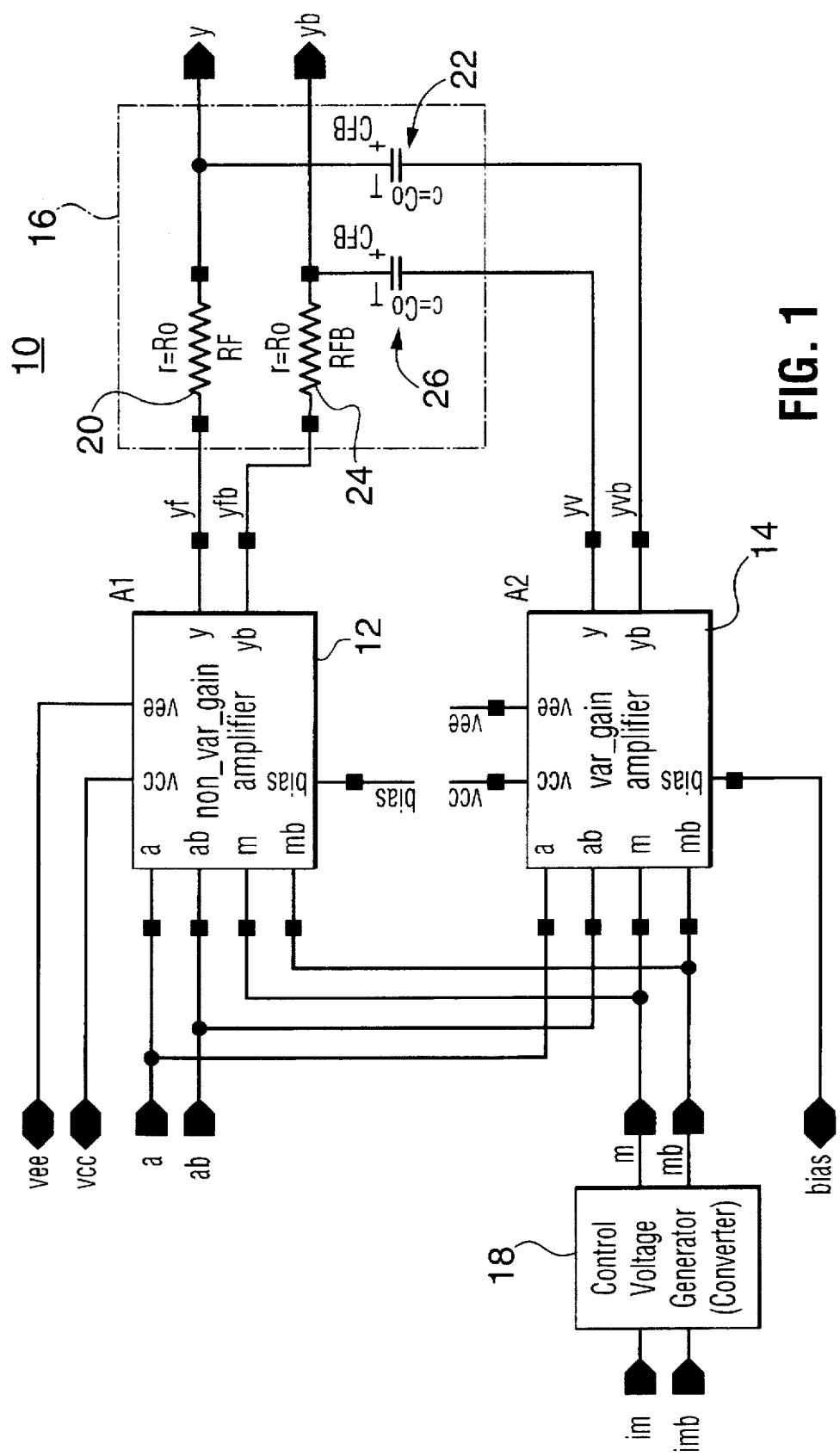
FIG. 1 shows a block diagram of an integrated circuit for providing variable RC delay according to a first embodiment of the present invention.

A block diagram for an integrated circuit 10 for providing variable RC delay according to a first embodiment of the present invention is shown in FIG. 1.

The circuit 10 is designed for differential operation circuit for receiving a pair of input signals V(a,ab) and generating a pair of output signals V(y,yb) having a controllable and variable delay relative to the input signals V(a,ab) and comprises pairs of amplifiers 12 and 14 coupled to an RC delay sub-circuit 16. The pair of amplifiers comprise a non-variable (fixed) gain amplifier 12 and a variable gain amplifier 14, with outputs of the amplifiers coupled to an resistor-capacitor (RC) sub-circuit 16 comprising a pair of identical RC delay circuit elements comprising a resistor element 20 and capacitor element 22, and a corresponding resistor element 24 and capacitor 26. Each capacitor has a capacitance value $C_o$ and each resistor has resistance $R_o$.

Each of the pair of amplifiers are matched so that propagation delay through each is identical, and each amplifier is coupled to supply voltages $V_{ee}$ and $V_{cc}$, and a biasing means is connected to each amplifier to provide operating voltage $V_{bias}$ to the circuit, in a conventional manner. The differential input signals V(a,ab) and differential control voltage V(m,mb) are coupled to respective pairs of inputs of each amplifier. The amplifiers are configured so that the gain m of the variable gain amplifier is dependent on the control voltage V(m,mb) whereas the gain of the fixed gain amplifier is independent of V(m,mb). For linear variation of the delay with the control voltage, the actual control voltage V(m,mb) is provided by a linear to logarithmic voltage generator 18 driven by an input control voltage V(im,imb), as will be explained below.

The outputs V(yf,yfb) of the fixed gain amplifier and V(yv,yvb) of the variable gain amplifier are coupled to the pair of RC delay circuit elements of sub-circuit 16 as shown in FIG. 1, to generate the output voltage V(y,yb) which is therefore dependent on the gain of the variable gain amplifier.

Thus, as shown in FIG. 1, the outputs of the variable gain amplifier V(yv,yvb) are coupled to the RC delay circuit so that an increase in control voltage V(m,mb) will increase the delay of the circuit. Conversely, a decrease in control voltage V(m,mb) will decrease the delay.

The resistor elements 20 and 24 and and capacitor elements 22 and 26 of the RC sub-circuit are implemented as resistors $R_o$ and capacitors $C_o$ as shown.

While active elements for this circuit are shown as bipolar devices, alternatively MOS devices may be used, if preferred. Alternatively the R and C elements may be implemented as active devices using MOS transistors.

Figure 2:
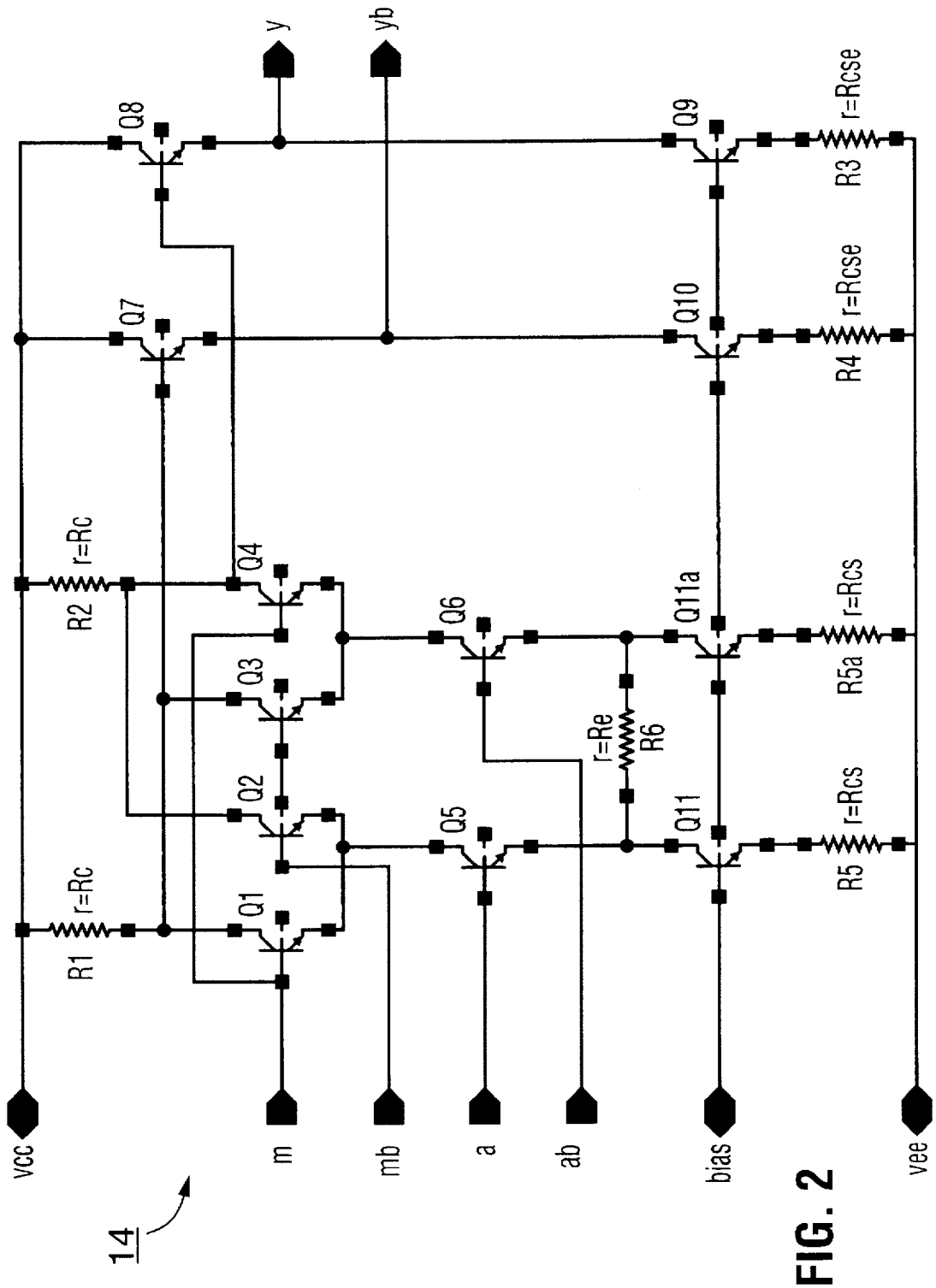
FIG. 2 shows a circuit schematic for a variable gain amplifier shown of FIG. 1.
Figure 3:
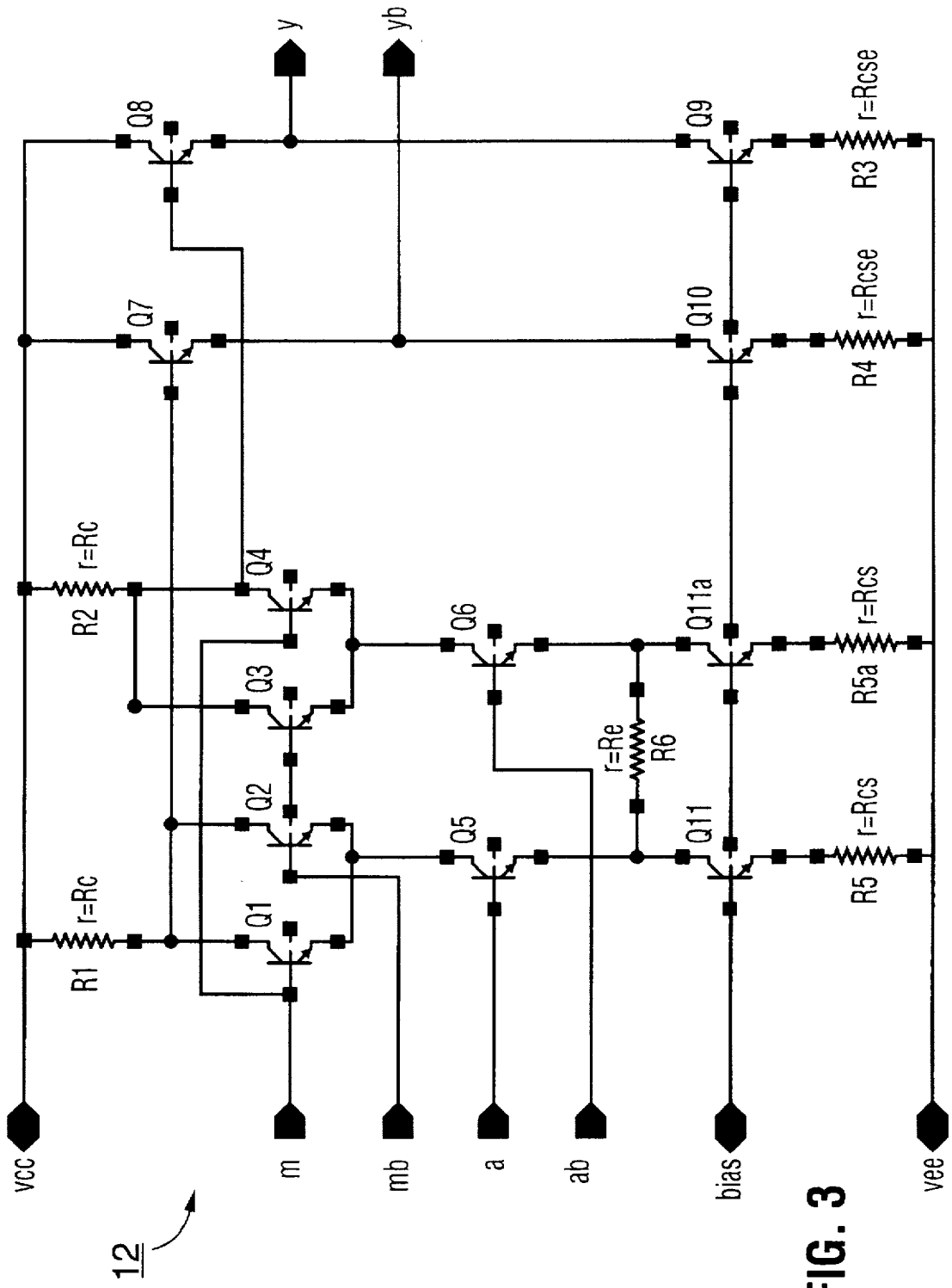
FIG. 3 shows a circuit schematic for a non-variable (fixed) gain amplifier shown in FIG. 1.

Suitable amplifiers for application in the circuit are, for example, based on well known balanced multiplier circuits, as shown in FIGS. 2 and 3. Since the operation of these balanced multipliers is conventional, their operation will not be described in detail.

The variable gain and fixed gain amplifiers shown in FIGS. 2 and 3 respectively, are identical, except that in the fixed gain amplifier, the collector connections are changed for a well-known cascode type amplifier, so that the output voltage is independent of m. Nevertheless, since the two amplifiers are otherwise identical, the propagation delay through each amplifier is matched.

Figure 4:
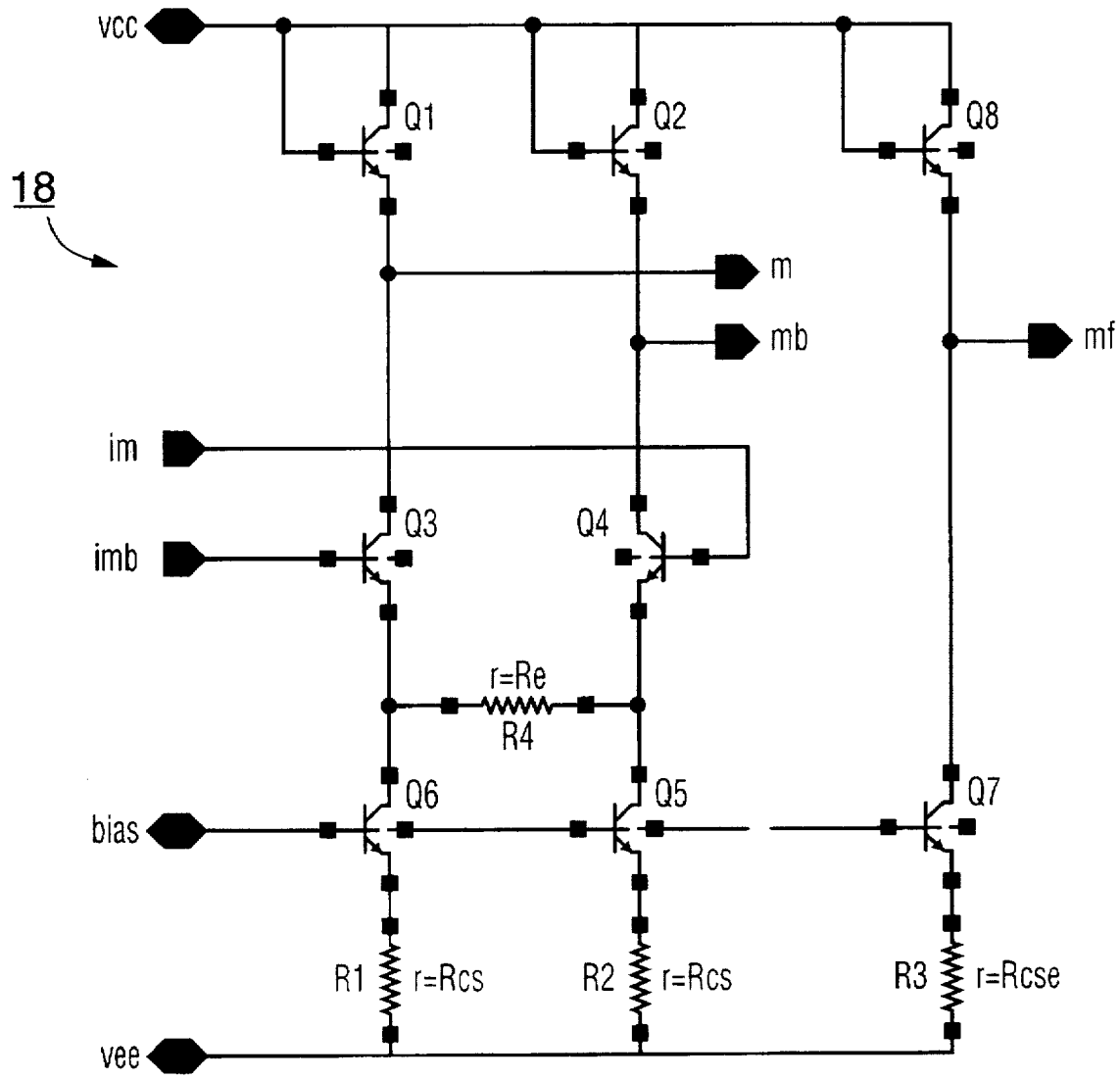
FIG. 4 is a circuit schematic for a control voltage generator for the circuit shown FIG. 1.

As will be explained in more detail below, because the gain m of a balanced multiplier circuit typically has a non-linear dependence on the control voltage V(m,mb), an effective linear dependence on an applied control voltage V(im,imb) can be obtained by using a reference voltage V(m,mb) generator circuit which is a linear to logarithmic converter, for example as shown in FIG. 4, driven by a control voltage V(im,imb).

Differential operation is recommended for most monolithic integrated circuit applications and thus for generality the circuits are shown for pairs of input signals of a differential type. Alternatively, the circuit may be implemented as a single ended circuit when one of each pair of differential inputs is provided as a reference voltage.

The operation of the circuit and the dependence of the delay of the output signal V(y,yb) relative to the input signal V(a,ab) on the gain m of the variable gain amplifier may be explained by analysis in the time domain or frequency domain as follows.

With reference to the circuits shown in FIGS. 2 and 3, the output voltage $U_v$, V(y,yb) of each amplifier 12 and 14, for an input voltage, $U_i$, V(a,ab) is a function of the amplifier gain and the splitting and multiplying factor m, where the amplifier gain is the ratio of the collector and emitter (emitter degeneration) resistor values $R_c/R_e$, where $R_c$ is the value of the collector resistance R1 and R2, and $R_e$ is the emitter resistance R6. The splitting or multiplying factor m ($-1 \leq m \leq 1$) is controlled by V(m,mb). The gain dependence on the control voltage V(m,mb) in this type of circuit is typically exponential. A linear dependence of the gain on the control voltage can be obtained by using a linear to logarithmic converter as shown in FIG. 4 to generate an actual control voltage V(m,mb). The splitting factor thus becomes a linear function of the input control voltage V(im,imb) fed to the converter.

Consequently, the output voltage $U_v$, V(a,ab) can be written as a function of the gain m and the maximum output voltage $U_O$ (for m=1, no splitting), $$U_v = m \cdot U_o \quad (1)$$

The output voltage $U_v$ varies between $-U_o$ and $U_o$ ($-U_o \leq U_v \leq U_o$). In the time domain, the output voltage can be seen as the product of the output voltage $u_o(t)$ and a multiplying factor m, $$u_v(t) = m(t) \cdot u_o(t) \quad (2)$$

If the splitting factor m is constant, or slow varying, the output voltage becomes $$u_v(t) = m \cdot u_o(t) \quad (3)$$

In the frequency domain the output voltage can be written $$U_v(s) = m \cdot U_o(s) \quad (4)$$

The variable gain amplifier adds a delay (propagation time) in the output signal V(y,yb) relative to the input signal V(a,b).

The fixed gain amplifier is configured so that the output voltage V(yf,yfb) is independent of m, but the amplifiers are otherwise similar, so that the propagation time (delay) is matched to the propagation time through the variable gain amplifier. In operation of the fixed gain amplifier, it is preferable that the control voltage V(m,mb) may be fed as two inputs m,mb from the corresponding outputs V(m,mb) of the reference voltage generator. This arrangement using separate control inputs reduces kick-back noise. Alternatively the two inputs may be connected together to a constant bias voltage, which also provides for similar operation of the circuit.

The output voltage of the amplifier is then $$u_f(t) = u_o(t) \quad (5)$$

in the time domain or $$U_f(s) = U_o(s)$$

in the frequency domain.

The operating conditions of the circuits shown in FIGS. 2 to 4 are controlled by the bias voltage $V_{bias}$, tail current sources Q11, Q11a, Q10, Q9 (FIGS. 2 and 3) and correspondingly Q5, Q6, and Q7 (FIG. 4) for the control voltage generator, and resistors $R_{cs}$ and $R_{cse}$. In alternative circuit implementations, the tail current sources may be replaced by resistors connected to the negative voltage $V_{ee}$.

TIME DOMAIN ANALYSIS

The time constant of an RC sub-circuit comprising two identical RC circuit elements (RF,CF) and (RFB,CFB) is $$\tau_o = R_o \cdot C_o \quad (6)$$

The output voltage V(y,yb) of the RC sub-circuit is calculated using the superposition theorem.

If the output impedance of the two amplifiers, which are configured as emitter followers, is small compared to RF and RFB, (resistor value $R_o$) and the loading capacitance (load capacitance at the two outputs y and yb) is small compared to the two capacitors, CF and CFB (capacitor value $C_o$), the output voltage is the sum of the contribution of the two amplifiers.

The contribution in the change in the differential output voltage V(y,yb) due to the non-variable gain amplifier, for a step change $U_o$ can be written as $$u_f(t) = U_o \cdot (1 - e^{-t/\tau_o}) \quad (7)$$

The contribution of the variable gain amplifier in the change in the differential output is $$u_h(t) = -(m \cdot U_o \cdot e^{-t/\tau_o}) \quad (8)$$

Thus, the change in the output voltage becomes $$u_y(t) = u_f(t) + u_h(t) = U_o \cdot [1 - (1+m) \, e^{-t/\tau_o}] \quad (9)$$

The delay time, defined as the delay time of the crossing point in the differential output voltage V(y,yb) relative to the crossing point in the applied voltage V(yf,yfb) to the RC circuit can be calculated as the time needed to reach half of the input step, that is, when:

$$(1+m)e^{-t_c/\tau_0} = \frac{1}{2} \text{ and } t_c = \tau_0 \cdot \ln 2 \cdot \left[1 + \frac{\ln(1+m)}{\ln 2}\right] \quad (10)$$

For small values of |m|, equation (10) can be written as $$t_c = \tau_0 \cdot \ln 2 \cdot \left[1 + \frac{m}{0.693}\right] \quad (11)$$

where ln2=0.693) and the equivalent time constant of the RC delay circuit becomes $$t_{eq} = \tau_0 \cdot \left[1 + \frac{m}{0.693}\right] \quad (12)$$

The equivalent time constant of the RC delay circuit for small |m| is given by equation (12) is therefore; a linear function of m, i.e. the gain of the variable gain amplifier. Using a control voltage generator, as shown in FIG. 2, the equivalent time constant becomes a linear function of the control voltage V(im,imb).

Thus, the circuit implements a voltage controlled delay which can be used in the many applications where variable or adaptive delays are required.

Frequency domain analysis

In the frequency domain, starting the analysis with equations 4 and 5 and the assumptions above, $$U_y(s) = \frac{U_0 p_0}{s + p_0} - \frac{m \cdot U_0 \cdot s}{s + p_0} \quad (13)$$

where $p_o = 1/\tau_o$ is the pole frequency.

Then, equation 12 can be written as $$U_y(s) = \left[\frac{-m \cdot s + p_0}{s + p_0}\right] \cdot U_0 \quad (14)$$

The modulus |T(ω)| and the phase θ(ω) of the transfer function can be calculated from equation (14).

$$|T(\omega)| = \left|\frac{U_y(j\omega)}{U_0}\right| = \sqrt{\frac{1 + (m \cdot \omega \cdot \tau_0)^2}{1 + (\omega \cdot \tau_0)^2}} \quad (15)$$

$$\theta(\omega) = -\text{atan}(\omega \cdot \tau_0) - \text{atan}(m \cdot \omega \cdot \tau_0) \quad (16)$$

For frequencies close to the pole frequency, that is, $$\omega \cdot \tau_o \cong 1,$$

the modulus and the phase of the transfer function can be written $$|T(\omega_0)| \cong \frac{\sqrt{1+m^2}}{\sqrt{2}} \quad (17)$$

$$\theta(\omega_0) \cong -\frac{\pi}{4} - \text{atan}(m) \quad (18)$$

For small |m| and frequencies close to the pole frequency, the modulus and the phase of the transfer function become $$|T(\omega_0)| \cong \frac{1}{\sqrt{2}} \quad (19)$$

$$\theta(\omega_0) \cong -\frac{\pi}{4} - m \quad (20)$$

The circuit has a pole frequency $\theta(\omega_p) = \pi/4$ which has a linear dependence on m and the control voltage V(im,imb), in the frequency band around the pole frequency of the RC sub-circuit (ω·τ≅1).

The amplifiers circuits shown in FIGS. 2 and 3 are intended for linear (analog) applications. The emitter followers of FIG. 2 and 3 were added to simplify the analysis. For digital applications, the emitter degeneration resistor, R6, and additional current sources R5a, and Q11a are not required. The output voltage $U_o$ (voltage swing) then becomes a function of the bias current and the collector resistance $R_c$. Otherwise, the relations described above apply.

Although specific embodiments are described in detail above, it will be apparent that variations and modifications of these embodiments may be made within the scope of the following claims.

What is claimed is:

1. A circuit for receiving a pair of input signals and generating a pair of output signals having a controllable delay relative to the pair of input signals, the circuit comprising:

a pair of amplifiers, each amplifier having input means for independently receiving the pair of input signals and output means for generating a pair of output signals, each amplifier having a second input means for receiving a pair of control voltage signals for controlling the amplifier gain, first amplifier having a non-variable gain and the second amplifier having a variable gain responsive to the control voltage signals;

biasing means for providing operating voltage to each of the pair of amplifiers;

an RC sub-circuit comprising a pair of RC delay circuits each including a capacitor element and a resistance element, said RC sub-circuit having input means for receiving the pair of output signals from the pair of amplifiers and output means for generating a pair of outputs having a variable delay relative to the input signals to the amplifiers dependent on the gain control voltage fed to the second amplifier.

2. A circuit according to claim 1 wherein each amplifier comprises a balanced multiplier.

3. A circuit according claim 1 wherein the pair of amplifiers comprises a matched pair of balanced multipliers, wherein the non-variable gain amplifier is configured as a cascode amplifier.

4. A circuit according to claim 3 comprising a reference voltage generator for providing the control voltage signals.

5. A circuit according to claim 4 wherein the gain of the amplifiers has a non-linear dependence on the control voltage signals and the reference voltage generator comprises a linear to logarithmic converter having input means for receiving an input control voltage signal, thereby the gain of the second amplifier having a linear dependence on the input control voltage signal.

6. A circuit according to claim 5 wherein an increase in the input control voltage causes an increase in the delay.

7. A circuit according to claim 1 wherein the resistor element and capacitor element are provided by a resistor and a capacitor respectively.

8. A circuit according to claim 1 wherein the resistor element and capacitor element are provided by MOS transistors.

9. A circuit according to claim 1 implemented using active devices selected from bipolar and MOS transistors.

* * * * *